(12) United States Patent
Kim et al.

(10) Patent No.: US 10,096,549 B2
(45) Date of Patent: Oct. 9, 2018

(54) SEMICONDUCTOR DEVICES HAVING INTERCONNECTION STRUCTURE

(71) Applicant: Samsung Electronics Co., Ltd., Suwon-si, Gyeonggi-do (KR)

(72) Inventors: Byung Hee Kim, Seoul (KR); Thomas Oszinda, Hwaseong-si (KR); Deok Young Jung, Seoul (KR); Jong Min Baek, Seoul (KR); Tae Jin Yim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/480,055

(22) Filed: Apr. 5, 2017

(65) Prior Publication Data
US 2018/0076140 A1 Mar. 15, 2018

(30) Foreign Application Priority Data
Sep. 12, 2016 (KR) .......................... 10-2016-0117172

(51) Int. Cl.
*H01L 23/48* (2006.01)
*H01L 23/532* (2006.01)
*H01L 23/522* (2006.01)
*H01L 21/768* (2006.01)

(52) U.S. Cl.
CPC .... *H01L 23/5329* (2013.01); *H01L 21/76802* (2013.01); *H01L 21/76822* (2013.01); *H01L 21/76829* (2013.01); *H01L 21/76846* (2013.01); *H01L 21/76873* (2013.01); *H01L 21/76879* (2013.01); *H01L 23/5226* (2013.01); *H01L 23/53238* (2013.01)

(58) Field of Classification Search
CPC ............. H01L 23/5329; H01L 23/5226; H01L 23/53238; H01L 21/76829
USPC ........................................ 257/758, 760, 750
See application file for complete search history.

(56) References Cited

U.S. PATENT DOCUMENTS 5,561,318 A * 10/1996 Gnade ............... H01L 21/02126
257/637
6,093,649 A 7/2000 Roberts
6,316,354 B1 11/2001 Hu
(Continued)

FOREIGN PATENT DOCUMENTS

JP 2006-86411 A 3/2006

*Primary Examiner* — Nitin Parekh
(74) *Attorney, Agent, or Firm* — Myers Bigel, P.A.

(57) ABSTRACT

Semiconductor devices including an interconnection structure are provided. The devices may include an etch stop layer on a lower structure including a contact structure, a buffer layer on the etch stop layer, an intermetal insulating layer including a low-k dielectric material on the buffer layer. The intermetal insulating layer may include a first region having a first dielectric constant and a second region having a second dielectric constant different from the first dielectric constant. The device may also include interconnection structure including a plug portion electrically connected to the contact structure and an interconnection portion on the plug portion. The plug portion may include a first portion extending through the etch stop layer and a second portion that is in the intermetal insulating layer and has a width greater than a width of the first portion. The interconnection portion may include opposing lateral surfaces surrounded by the intermetal insulating layer.

20 Claims, 18 Drawing Sheets

(56) References Cited

U.S. PATENT DOCUMENTS

| | | | |
|---|---|---|---|
| 6,346,490 B1 | 2/2002 | Catabay et al. | |
| 6,541,863 B1 * | 4/2003 | Horstmann | H01L 21/7682 |
| | | | 257/614 |
| 6,713,382 B1 | 3/2004 | Pangrie et al. | |
| 6,737,345 B1 * | 5/2004 | Lin | H01L 23/5258 |
| | | | 257/529 |
| 7,083,991 B2 | 8/2006 | Gaynor | |
| 7,135,402 B2 | 11/2006 | Lin et al. | |
| 7,135,404 B2 * | 11/2006 | Baskaran | C25D 3/38 |
| | | | 438/652 |
| 7,163,900 B2 | 1/2007 | Weber | |
| 7,223,704 B2 | 5/2007 | Weber | |
| 7,253,105 B2 | 8/2007 | Dimitrakopoulos et al. | |
| 7,314,828 B2 | 1/2008 | Lin et al. | |
| 7,365,026 B2 | 4/2008 | Jeng et al. | |
| 7,387,973 B2 | 6/2008 | Wang et al. | |
| 7,482,265 B2 | 1/2009 | Chen et al. | |
| 7,517,790 B2 | 4/2009 | Fitzsimmons et al. | |
| 7,541,200 B1 | 6/2009 | van Schravendijk et al. | |
| 7,572,728 B2 * | 8/2009 | Kim | H01L 21/76811 |
| | | | 257/758 |
| 7,598,169 B2 | 10/2009 | Lin et al. | |
| 7,709,371 B2 | 5/2010 | Bhanap et al. | |
| 7,741,224 B2 | 6/2010 | Jiang et al. | |
| 7,807,219 B2 | 10/2010 | DeYoung | |
| 7,851,232 B2 | 12/2010 | van Schravendijk et al. | |
| 7,915,181 B2 | 3/2011 | Fan et al. | |
| 7,948,083 B2 | 5/2011 | Dimitrakopoulos et al. | |
| 7,981,699 B2 | 7/2011 | Sirard et al. | |
| 7,998,875 B2 | 8/2011 | DeYoung | |
| 8,034,638 B1 | 10/2011 | Schravendijk et al. | |
| 8,048,687 B2 | 11/2011 | Shimizu et al. | |
| 8,216,861 B1 | 7/2012 | Yim et al. | |
| 8,358,007 B2 | 1/2013 | Sohn et al. | |
| 8,440,579 B2 * | 5/2013 | Schaller | H01L 21/76826 |
| | | | 257/759 |
| 8,465,991 B2 | 6/2013 | Varadarajan et al. | |
| 8,492,170 B2 | 7/2013 | Xie et al. | |
| 8,575,041 B2 | 11/2013 | Schaller et al. | |
| 8,614,140 B2 | 12/2013 | Asako et al. | |
| 8,815,745 B2 | 8/2014 | Kang et al. | |
| 8,829,675 B2 | 9/2014 | Ryan et al. | |
| 8,870,164 B2 | 10/2014 | Shimizu | |
| 8,877,659 B2 | 11/2014 | Chan et al. | |
| 8,980,769 B1 | 3/2015 | Haverkamp et al. | |
| 9,087,916 B2 | 7/2015 | Chang et al. | |
| 9,123,532 B2 | 9/2015 | Chan et al. | |
| 9,236,279 B2 | 1/2016 | Yun et al. | |
| 9,236,294 B2 | 1/2016 | Chou et al. | |
| 2003/0181034 A1 * | 9/2003 | Jiang | H01L 21/31116 |
| | | | 438/638 |
| 2003/0224595 A1 * | 12/2003 | Smith | H01L 21/02063 |
| | | | 438/637 |
| 2008/0318412 A1 * | 12/2008 | Iba | H01L 21/02063 |
| | | | 438/627 |
| 2014/0170780 A1 | 6/2014 | Yun et al. | |
| 2016/0307793 A1 * | 10/2016 | Huang | H01L 21/76879 |

* cited by examiner

'A'

I-I'

II-II'

I-I'

II-II'

I-I'

II-II'

II-II'

000# SEMICONDUCTOR DEVICES HAVING INTERCONNECTION STRUCTURE

CROSS-REFERENCE TO RELATED APPLICATION

This application claims priority under 35 U.S.C. § 119 to Korean Patent Application No. 10-2016-0117172, filed on Sep. 12, 2016 in the Korean Intellectual Property Office, the disclosure of which is incorporated herein by reference in its entirety.

BACKGROUND

The present disclosure relates to semiconductor devices having an interconnection structure and methods of forming the same.

As the degree of integration of semiconductor devices increases, sizes of interconnection structures of semiconductor devices and distances between the interconnection structures decrease. Accordingly, parasitic capacitance between interconnection structures may increase. As a result, it may be difficult to improve the performance of semiconductor devices.

SUMMARY

Some embodiments of the present inventive concept may provide semiconductor devices having improved performance and methods of forming the same.

According to an aspect of the present inventive concept, semiconductor devices are provided. The devices may include an etch stop layer on a lower structure including a contact structure, a buffer layer on the etch stop layer, an intermetal insulating layer including a low-k dielectric material on the buffer layer. The intermetal insulating layer may include a first region having a first dielectric constant and a second region having a second dielectric constant different from the first dielectric constant. The device may also include interconnection structure including a plug portion electrically connected to the contact structure and an interconnection portion on the plug portion. The plug portion may include a first portion extending through the etch stop layer and a second portion that is in the intermetal insulating layer and has a width greater than a width of the first portion. The interconnection portion may include opposing lateral surfaces surrounded by the intermetal insulating layer.

According to an aspect of the present inventive concept, semiconductor devices are provided. The device may include an etch stop layer on a lower structure, an intermetal insulating layer including a low-k dielectric material on the etch stop layer, and a first interconnection structure and a second interconnection structure adjacent to each other. The intermetal insulating layer may include a first region that is spaced apart from the first and second interconnection structures and has a first dielectric constant, and second regions that contact the first and second interconnection structures and have a second dielectric constant different from the first dielectric constant of the first region. The first interconnection structure may include a first plug portion and a first interconnection portion on the first plug portion, and the second interconnection structure may include a second plug portion and a second interconnection portion on the second plug portion. Each of the first plug portion and the second plug portion may include a lower portion contacting the etch stop layer and an upper portion contacting the intermetal insulating layer. A distance between the lower portions of the first plug portion and the second plug portion may be greater than a distance between the upper portions of the first plug portion and the second plug portion.

According to some embodiments, integrated circuit devices may include an etch stop layer on a lower structure and an insulating layer comprising a low-k material on the etch stop layer. The etch stop layer may include an opening exposing the lower structure. The insulating layer may include a recess and may include a first portion that defines the recess and has a first dielectric constant and a second portion that is different from the first portion and has a second dielectric constant less than the first dielectric constant. The devices may also include a conductive structure in the recess of the insulating layer and in the opening of the etch stop layer.

BRIEF DESCRIPTION OF DRAWINGS

The above, and other aspects, features, and advantages of the present inventive concept will be more clearly understood from the following detailed description when taken in conjunction with the accompanying drawings, in which.

DETAILED DESCRIPTION

Figure 1:
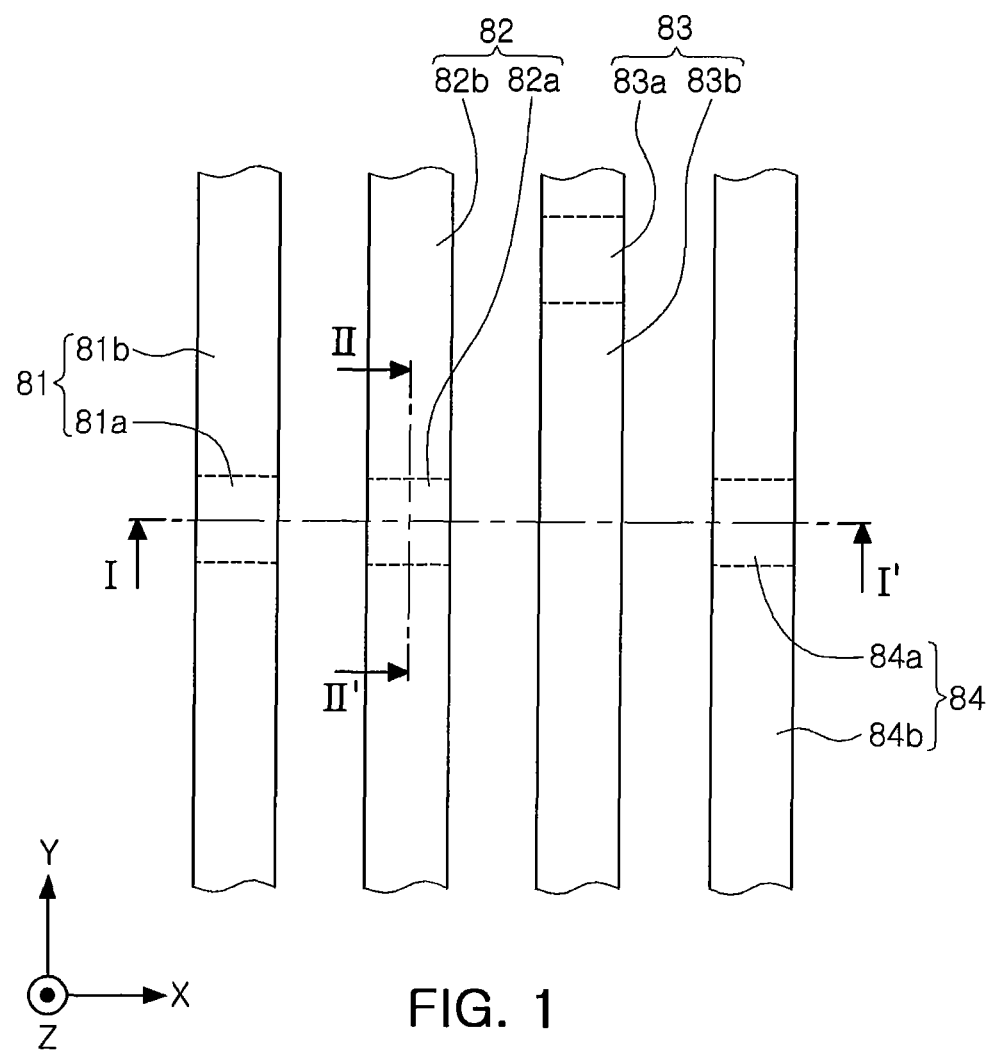
FIG. 1 is a plan view of a semiconductor device according to some embodiments of the present inventive concept.
Figure 2A:
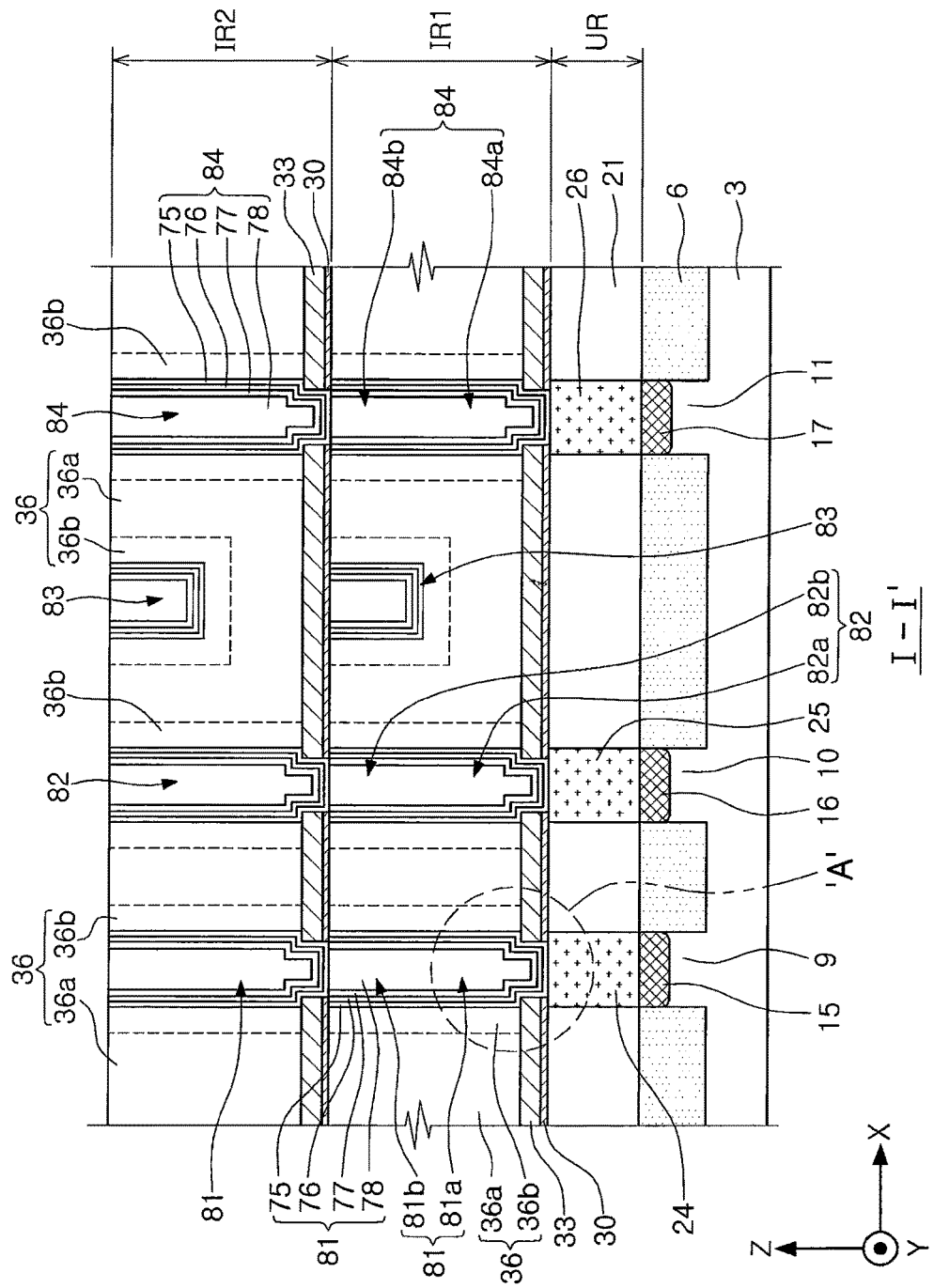
FIG. 2A is a cross-sectional view taken along the line I-I' of FIG. 1 according to some embodiments of the present inventive concept.
Figure 2B:
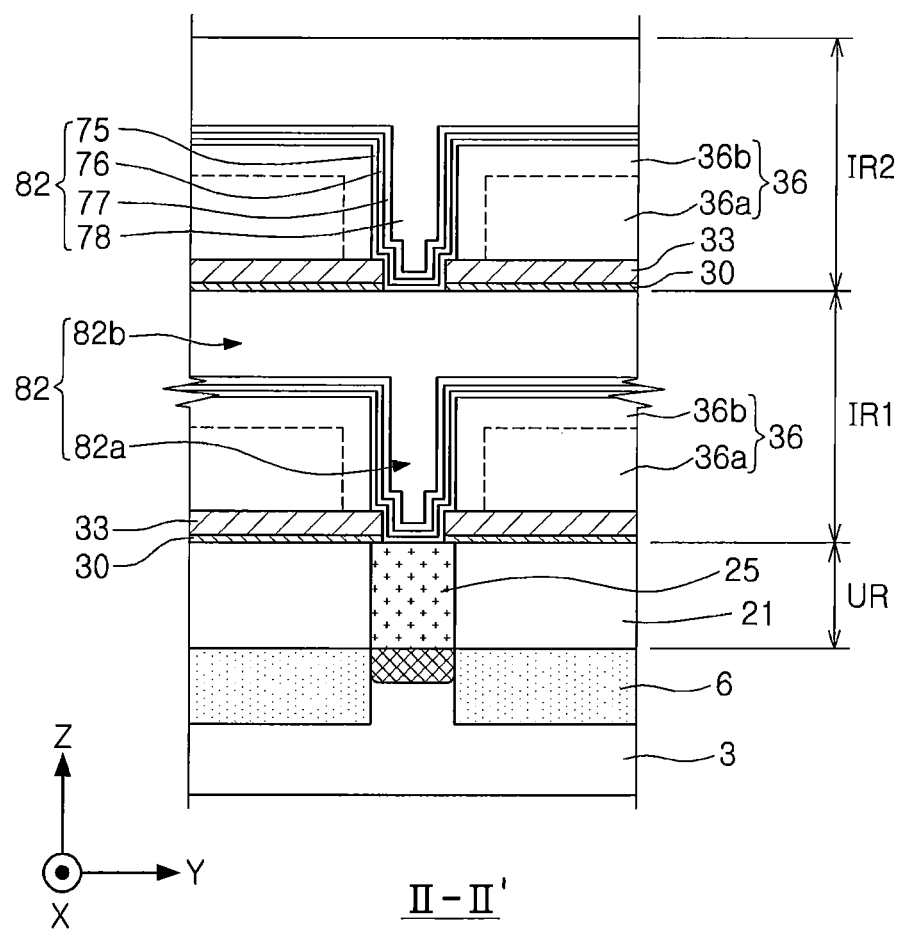
FIG. 2B is a cross-sectional view taken along the line II-II' of FIG. 1 according to some embodiments of the present inventive concept.
Figure 2C:
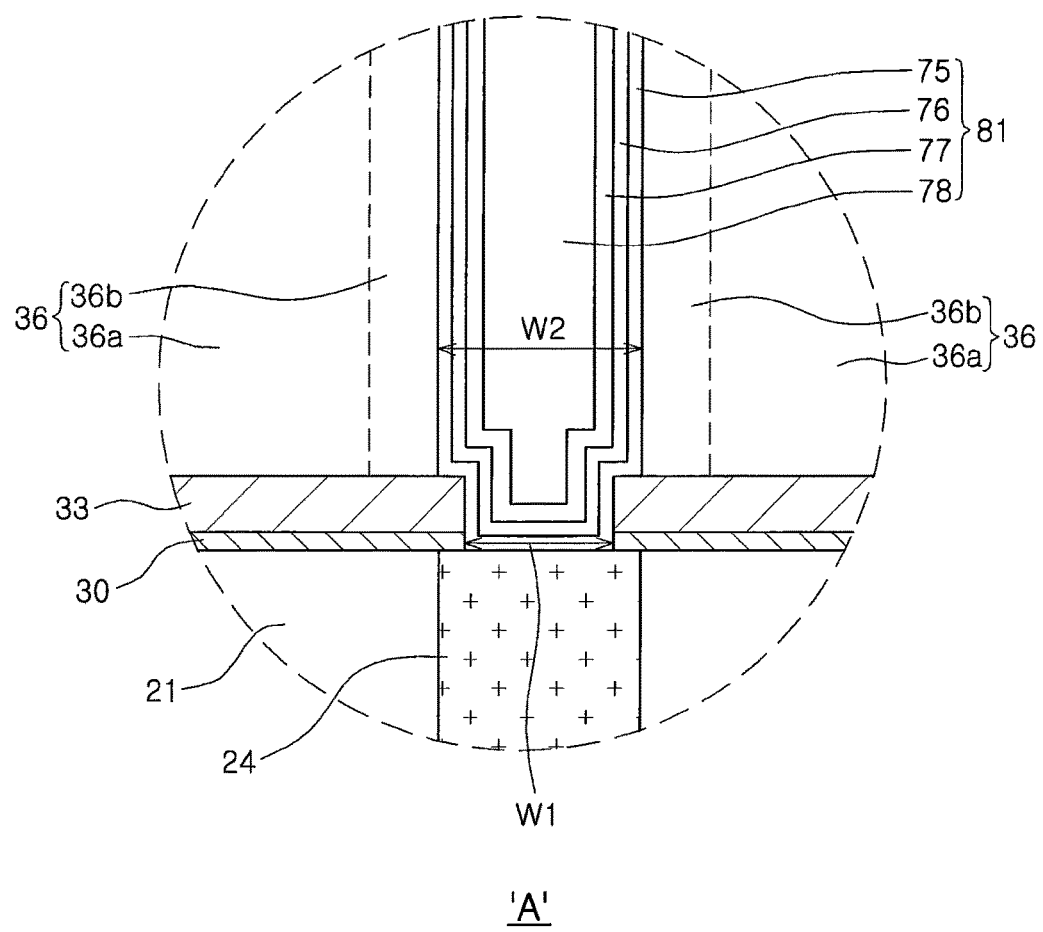
FIG. 2C is an enlarged view of a portion of a semiconductor device according to some embodiments of the present inventive concept.
Figure 2D:
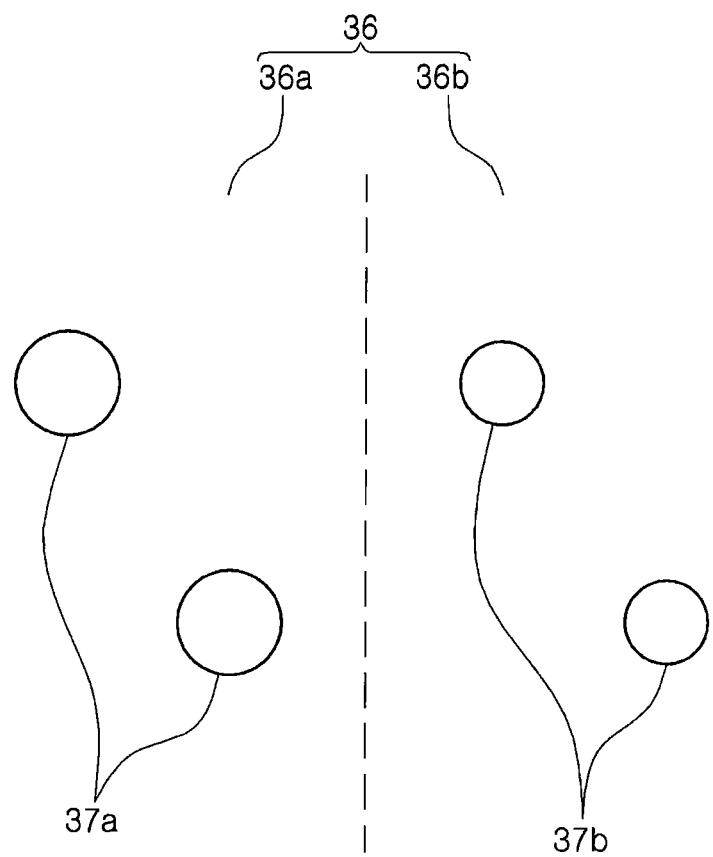
FIG. 2D is an enlarged view of a portion of an intermetal insulating layer.

Referring to FIGS. 1 and 2A through 2D, a semiconductor device according to some embodiments of the present inventive concept will be described. FIG. 1 is a plan view of a semiconductor device according to some embodiments of the present inventive concept. FIG. 2A is a cross-sectional view taken along the line I-I' of FIG. 1. FIG. 2B is a cross-sectional view taken along the line II-II' of FIG. 1. FIG. 2C is an enlarged view of the region A of FIG. 2A. FIG. 2D is an enlarged view of an intermetal insulating layer.

Referring to FIGS. 1 and 2A to 2D, a lower structure UR may be disposed on a semiconductor substrate 3. The lower structure UR may include an interlayer insulating layer 21 and first to third contact structures 24, 25, and 26 passing through the interlayer insulating layer 21. The interlayer insulating layer 21 may be formed of a silicon oxide. The first to third contact structures 24 to 26 may be electrically connected to contact regions 15, 16, and 17 of the semiconductor substrate 3.

In some embodiments, the contact regions 15 to 17 may be impurity regions disposed within active regions 9, 10, and 11 defined by an isolation region 6 formed on the semiconductor substrate 3. However, the present inventive concept is not limited thereto. For example, each of the contact regions 15 to 17 may be a gate contact region, a source/drain contact region, a well contact region, a resistor contact region, or a capacitor contact region included in an integrated circuit (IC) device. The first to third contact structures 24 to 26 may be formed of a metallic material.

An etch stop layer 30 may be disposed on the lower structure UR. A buffer layer 33 may be disposed on the etch stop layer 30. The buffer layer may have a thickness greater than that of the etch stop layer 30. An intermetal insulating layer 36 that has a thickness greater than that of the buffer layer 33 may be disposed on the buffer layer 33. The intermetal insulating layer 36 may have a dielectric constant lower than that of the interlayer insulating layer 21. The intermetal insulating layer 36 may be formed of a low-k dielectric material.

It will be understood that the low-k dielectric material may refer to a dielectric material having a dielectric constant lower than that of silicon oxide.

The etch stop layer 30 may be formed of an insulating material having etching selectivity with respect to the buffer layer 33 and the intermetal insulating layer 36. In some embodiments, the etch stop layer 30 may be formed of an insulating nitride. For example, the etch stop layer 30 may be formed of an insulating nitride such as AlN.

The buffer layer 33 may be formed of an insulating material having a denser film quality than that of the intermetal insulating layer 36. In some embodiments, the buffer layer 33 may include an insulating material that has a density higher than a density of the intermetal insulating layer 36. For example, the intermetal insulating layer 36 may be formed of a porous low-k dielectric material, and the buffer layer 33 may be formed of a material containing silicon (Si), carbon (C), or oxygen (O). For example, the intermetal insulating layer 36 may be formed of SiOCH material or porous SiOCH material, and the buffer layer 33 may be formed of SiCO material. In some embodiments, the buffer layer 33 may be formed of a material different from SiCO material and may be formed of a material such as SiOCN material, SiON material, or $SiO_2$ material.

Referring to FIG. 1, first to fourth interconnection structures 81, 82, 83, and 84 may be arranged along a first direction X. The first to fourth interconnection structures 81 to 84 may include first to fourth plug portions 81a, 82a, 83a, and 84a and first to fourth interconnection portions 81b, 82b, 83b, and 84b, which are disposed on the first to fourth plug portions 81a to 84a and integrated with the first to fourth plug portions 81a to 84a, respectively. In plan view, each of the first to fourth interconnection portions 81b to 84b of the first to fourth interconnection structures 81 to 84 may have a line shape that extends in a second direction Y, which is different from the first direction X.

Each of the first to fourth interconnection structures 81 to 84 may include a first conductive layer 75, a second conductive layer 76, a seed layer 77, and a third conductive layer 78. In some embodiments, the first and second conductive layers 75 and 76 and the seed layer 77 may conformally cover a lateral surface and a bottom surface of the third conductive layer 78 as illustrated in FIGS. 2A and 2B. The second conductive layer 76 may be disposed between the first conductive layer 75 and the seed layer 77, and the seed layer 77 may contact the third conductive layer 78.

In some embodiments, the third conductive layer 78 may be formed of a metallic material, for example, copper (Cu) or the like, using an electroplating process. The seed layer 77 may be a copper seed layer. In some embodiments, the first conductive layer 75 may be formed of a metal nitride, for example, TaN, TiN, or the like, and the second conductive layer 76 may be formed of a metallic material, for example, titanium (Ti), tantalum (Ta), ruthenium (Ru), or the like.

In some embodiments, the first and second interconnection structures 81 and 82 may be adjacent to each other, as illustrated in FIGS. 1 and 2A. The first interconnection structure 81 may include a first plug portion 81a and a first interconnection portion 81b disposed on the first plug portion 81a, and the second interconnection structure 82 may include a second plug portion 82a and a second interconnection portion 82b disposed on the second plug portion 82a.

Referring to FIGS. 2A and 2B, the first and second interconnection portions 81b and 82b may have lateral surfaces surrounded by the intermetal insulating layer 36. Bottom surfaces of the first and second interconnection portions 81b and 82b may be disposed within the intermetal insulating layer 36.

Referring to FIG. 2C, the first and second plug portions 81a and 82a adjacent to each other may include lower portions having a width W1 and passing through the etch stop layer 30, and upper portions having a width W2 and disposed within the intermetal insulating layer 36. In the first and second plug portions 81a and 82a, the lower portions having the width W1 may be defined by the etch stop layer 30, and the upper portions having the width W2 may be defined by the intermetal insulating layer 36. In some embodiments, the lower portions having the width W1 may have lateral surfaces surrounded by the etch stop layer 30, and the upper portions having the width W2 may have lateral surfaces surrounded by the intermetal insulating layer 36. In some embodiments, the etch stop layer 30 may surround the lower portions of the first and second plug portions 81a and 82a, which have the width W1, and the intermetal insulating layer 36 may surround the upper portions of the first and second plug portions 81a and 82a, which have the width W2.

In the first and second plug portions 81a and 82a, the upper portions having the width W2 may be wider than the lower portions having the width W1. In some embodiments, a distance between the lower portions, having the width W1, of the first and second plug portions 81a and 82a in the first direction X may be greater than a distance between the upper portions, having the width W2, of the first and second plug portions 81a and 82a in the first direction X as illustrated in FIG. 2A.

In some embodiments, the opposing lateral surfaces of the first interconnection portion 81b and lateral surfaces of the first plug portion 81a may be aligned with each other in a vertical direction as illustrated in FIG. 2A. Likewise, in some embodiments, the opposing lateral surfaces of the second interconnection portion 82b and lateral surfaces of the second plug portion 82a may be aligned with each other in a vertical direction as illustrated in FIG. 2A.

In some embodiments, as illustrated in FIG. 1, one of the opposing lateral surfaces of the first interconnection portion 81b that extend in the second direction Y and a corresponding one of the lateral surfaces of the first plug portion 81a that extend in the second direction Y are aligned with each other in plan view, and thus the one of the opposing lateral surfaces of the first interconnection portion 81b and the corresponding one of the lateral surfaces of the first plug portion 81a are coplanar when viewed in cross section, as illustrated in FIG. 2A. In some embodiments, as illustrated in FIG. 1, one of the opposing lateral surfaces of the second interconnection portion 82b that extend in the second direction Y and a corresponding one of the lateral surfaces of the second plug portion 82a that extend in the second direction Y are aligned with each other in plan view, and thus the one of the opposing lateral surfaces of the second interconnection portion 82b and the corresponding one of the lateral surfaces of the second plug portion 82a are coplanar when viewed in cross section, as illustrated in FIG. 2A.

The intermetal insulating layer 36 may include a first region 36a and a second region 36b having different dielectric constants. The second region 36b may have a dielectric constant higher than that of the first region 36a. In the intermetal insulating layer 36, the second region 36b having the dielectric constant higher than that of the first region 36a may be closer to the first to fourth interconnection structures 81 to 84 than the first region 36a. The second region 36b may contact the first to fourth interconnection structures 81 to 84, and the first region 36a may be spaced apart from the first to fourth interconnection structures 81 to 84. In some embodiments, dielectric constants of the first region 36a and the second region 36b may be lower than a dielectric constant of silicon oxide. In some embodiments, dielectric constants of the first region 36a and the second region 36b may be lower than a dielectric constant of the buffer layer 33.

The first and second regions 36a and 36b of the intermetal insulating layer 36 may include first pores (e.g., vacancies) 37a and second pores (e.g., vacancies) 37b illustrated in FIG. 2D. The first pores 37a may have a size different from a size of the second pores 37b. The first region 36a may include the first pores 37a, and the second region 36b may include the second pores 37b that are smaller than the first pores 37a. The second pores 37b of the second region 36b may be closer to the first to fourth interconnection structures 81 to 84 than the first pores 37a of the first region 36a. In some embodiments, the second pores 37b may have an average size smaller than an average size of the first pores 37a.

The first to fourth plug portions 81a to 84a of the first to fourth interconnection structures 81 to 84 may have portions that pass through the buffer layer 33 and have a width different from at least one of a width of the portions of the first to fourth plug portions 81a to 84a passing through the etch stop layer 30 and a width of the portions of the first to fourth plug portions 81a to 84a passing through the intermetal insulating layer 36.

In some embodiments, the width of the portions of the first to fourth plug portions 81a to 84a passing through the buffer layer 33 may be narrower than the width of the portions of the first to fourth plug portions 81a to 84a passing through the intermetal insulating layer 36, while having the same as the width of the portions passing through the etch stop layer 30 as illustrated in FIG. 2C. However, the present inventive concept is not limited thereto. The width of the portions of the first to fourth plug portions 81a to 84a passing through the buffer layer 33 will be described with reference to FIGS. 3 and 4. For ease of description, the first plug portion 81a of the first interconnection structure 81 will principally be described.

Figure 3:
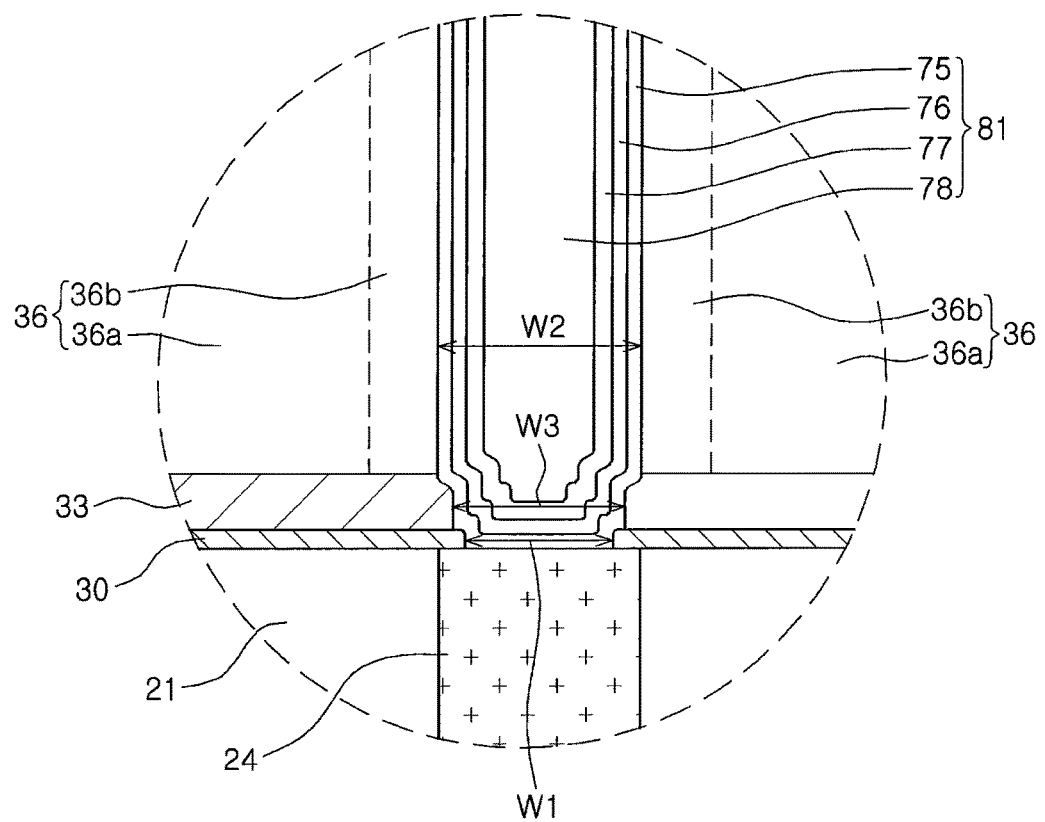
FIG. 3 is an enlarged cross-sectional view of a portion of a semiconductor device according to some embodiments of the present inventive concept.

Referring to FIG. 3, a portion passing through the buffer layer 33 of the first plug portion 81a may have a width W3 different from at least one of that of a portion having a width W1 and passing through the etch stop layer 30 and that of a portion having a width W2 and passing through the intermetal insulating layer 36. In the first plug portion 81a, the portion having the width W3 and passing through the buffer layer 33 may be wider than the portion having the width W1 and passing through the etch stop layer 30, while being narrower than the portion having the width W2 and passing through the intermetal insulating layer 36.

Figure 4:
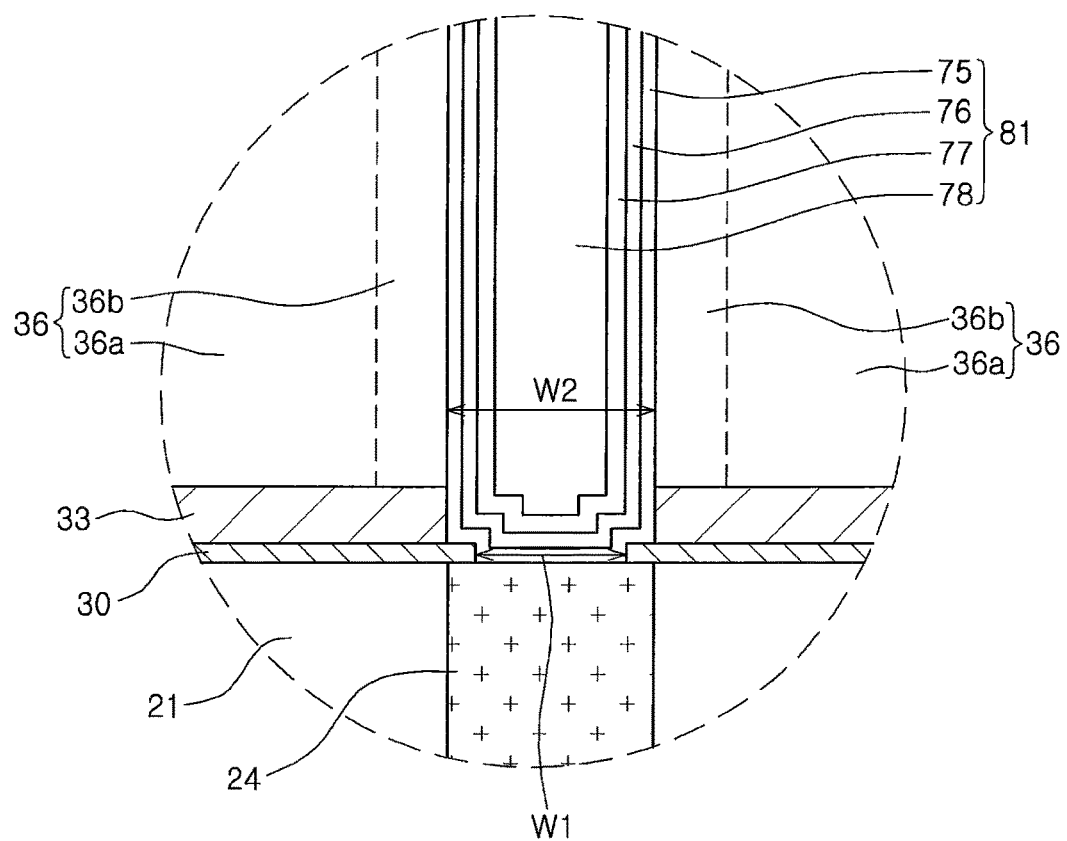
FIG. 4 is an enlarged cross-sectional view of a portion of a semiconductor device according to some embodiments of the present inventive concept.

Referring to FIG. 4, in the first plug portion 81a, a portion passing through the buffer layer 33 may have the same width as a portion having a width W2 and passing through the intermetal insulating layer 36, while being wider than a portion having a width W1 and passing through the etch stop layer 30.

The etch stop layer 30, the buffer layer 33, the intermetal insulating layer 36, and the first to fourth interconnection structures 81 to 84 may form a first interconnection region IR1. The first interconnection region IR1 may be disposed on the lower structure UR.

A semiconductor device according to some embodiments of the present inventive concept may include a plurality of stacked interconnection regions. For example, a second interconnection region IR2 may be disposed on the first interconnection region IR1. The second interconnection region IR2 may also include components same as or similar to those included in the first interconnection region IR1. Because the second interconnection region IR2 may include the components same as or similar to those included in the first interconnection region IR1, a detailed description of the second interconnection region IR2 will be omitted.

According to some embodiments, the intermetal insulating layer 36 disposed between the first to fourth interconnection structures 81 to 84 may be formed of a low-k dielectric material, and parasitic capacitance among the first to fourth interconnection structures 81 to 84 may thus be reduced. Because RC delay characteristics among the first to fourth interconnection structures 81 to 84 may be improved as a result, performance of a semiconductor device may be enhanced.

According to some embodiments, the intermetal insulating layer 36 may have the first region 36a spaced apart from the first to fourth interconnection structures 81 to 84, and the second region 36b contacting the first to fourth interconnection structures 81 to 84, and the second region 36b may have a dielectric constant higher than that of the first region 36a, and may include the second pores 37b, smaller than the first pores 37a of the first region 36a. The intermetal insulating layer 36 may increase durability of the semiconductor device.

According to some embodiments, in the first to fourth plug portions 81a to 84a of the first to fourth interconnection structures 81 to 84, the portion having the width W2 and surrounded by the intermetal insulating layer 36 may be wider than the portion having the width W1 and contacting the first to third contact structures 24 to 26 therebelow, and thus, electrical characteristics of the first to fourth interconnection structures 81 to 84 may be improved. Thus, performance of the semiconductor device may be enhanced.

According to some embodiments, lower surfaces of the first, second, and fourth plug portions 81a, 82a, and 84a that contact the first, second, and third contact structures 24, 25 and 26 may be narrow, and an electrical short circuit between the lower surfaces of the first, second, and fourth plug portions 81a, 82a, and 84a and other contact structures adjacent thereto may thus be reduced or possibly prevented.

An example of a method of forming a semiconductor device according to some embodiments of the present inventive concept described with reference to FIGS. 1 through 2C will be described with reference to FIGS. 5A through 12B. FIGS. 5A, 6A, 7A, 8A, 9A, 10A, 11A, and 12A are cross-sectional views taken along the line I-I' of FIG. 1, and FIGS. 5B, 6B, 7B, 8B, 9B, 10B, 11B, and 12B are cross-sectional views taken along the line II-II' of FIG. 1.

Figure 5A:
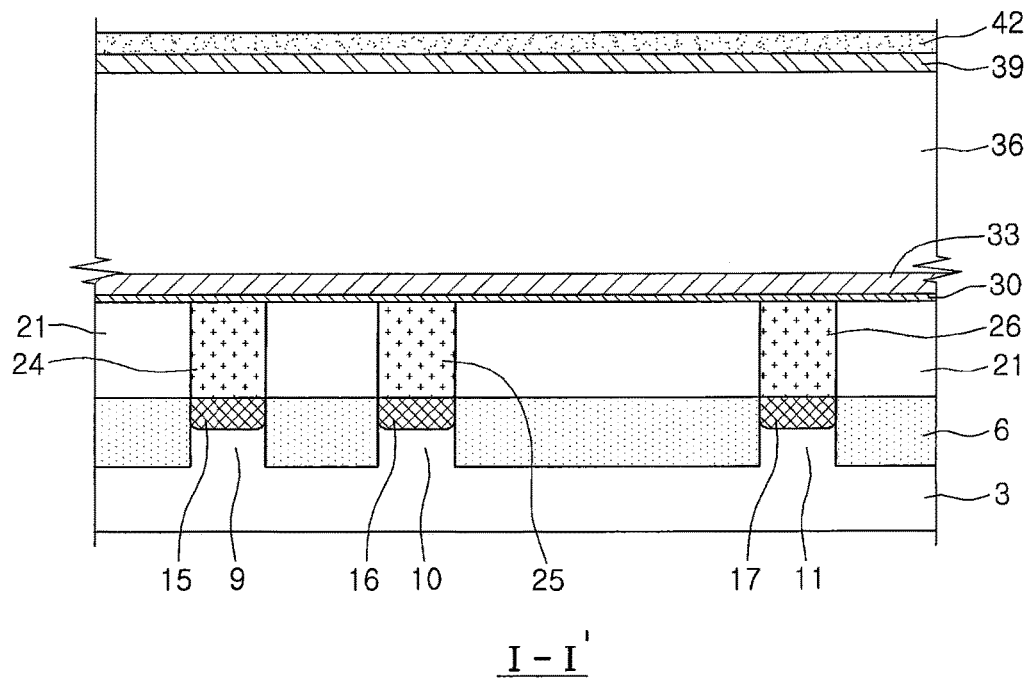
FIGS. 5A through 12B are cross-sectional views illustrating a method of forming a semiconductor device according to some embodiments of the present inventive concept.
Figure 5B:
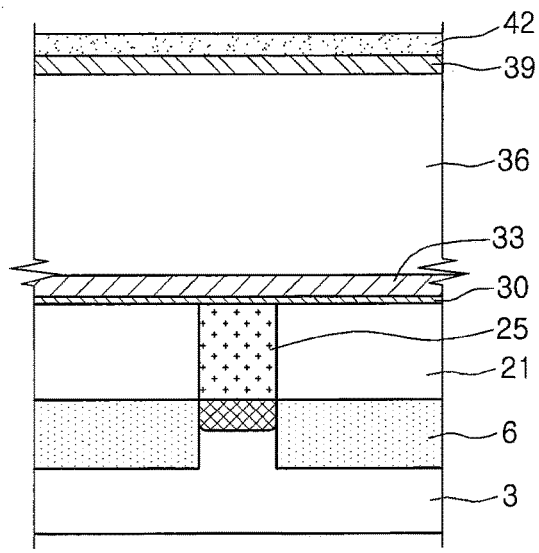

Referring to FIGS. 1, 5A, and 5B, the contact regions 15, 16, and 17 may be formed on the semiconductor substrate 3. In some embodiments, the formation of the contact regions 15, 16, and 17 may include forming the isolation region 6 defining the active regions 9, 10, and 11 on the semiconductor substrate 3 and forming impurity regions by injecting an impurity into the active regions 9, 10, and 11.

The interlayer insulating layer 21 may be formed on the semiconductor substrate 3 having the contact regions 15, 16, and 17. The interlayer insulating layer 21 may be formed of, for example, a silicon oxide. The first to third contact structures 24, 25, and 26 may be formed to pass through the interlayer insulating layer 21 and to be electrically connected to the contact regions 15, 16, and 17, respectively. The first to third contact structures 24 to 26 may be spaced apart from one another. In some embodiments, the first to third contact structures 24 to 26 may be formed of a metal nitride or a metallic material, for example, tungsten (W) or the like.

The etch stop layer 30 and the buffer layer 33 may be sequentially formed on the semiconductor substrate 3 having the interlayer insulating layer 21 and the first to third contact structures 24 to 26. The buffer layer 33 may have a thickness greater than that of the etch stop layer 30. The intermetal insulating layer 36 having a thickness greater than that of the buffer layer 33 may be disposed on the buffer layer 33.

The etch stop layer 30 may be formed of, for example, a nitride-based insulating material. For example, the etch stop layer 30 may be formed of an aluminum nitride (AlN). The intermetal insulating layer 36 may be formed of a low-k dielectric material having a dielectric constant lower than that of silicon oxide. For example, the intermetal insulating layer 36 may be formed of a SiOCH material or a porous SiOCH material. The buffer layer 33 may be formed of an insulating material having a denser film quality than that of the intermetal insulating layer 36. For example, the intermetal insulating layer 36 may be formed of a porous SiOCH material, and the buffer layer 33 may be formed of an insulating material, for example, SiCO, SiOCN, SiON, $SiO_2$, or the like, having a dense film quality. In some embodiments, the buffer layer 33 may include an insulating material that has a density higher than a density of the intermetal insulating layer 36.

A capping layer 39 and a hard mask 42 may be sequentially formed on the intermetal insulating layer 36. The capping layer 39 may be formed of a material having a denser film quality than that of the intermetal insulating layer 36 and may cover an upper surface of the intermetal insulating layer 36. For example, the capping layer 39 may be formed of an insulating material, for example, $SiO_2$ or SiON, having a denser film quality than that of the intermetal insulating layer 36. In some embodiments, the capping layer 39 may include an insulating material that has a density higher than a density of the intermetal insulating layer 36.

In some embodiments, the hard mask 42 may be formed of a nitride-based material. For example, the hard mask 42 may be formed of a metal nitride such as TiN or the like.

Figure 6A:
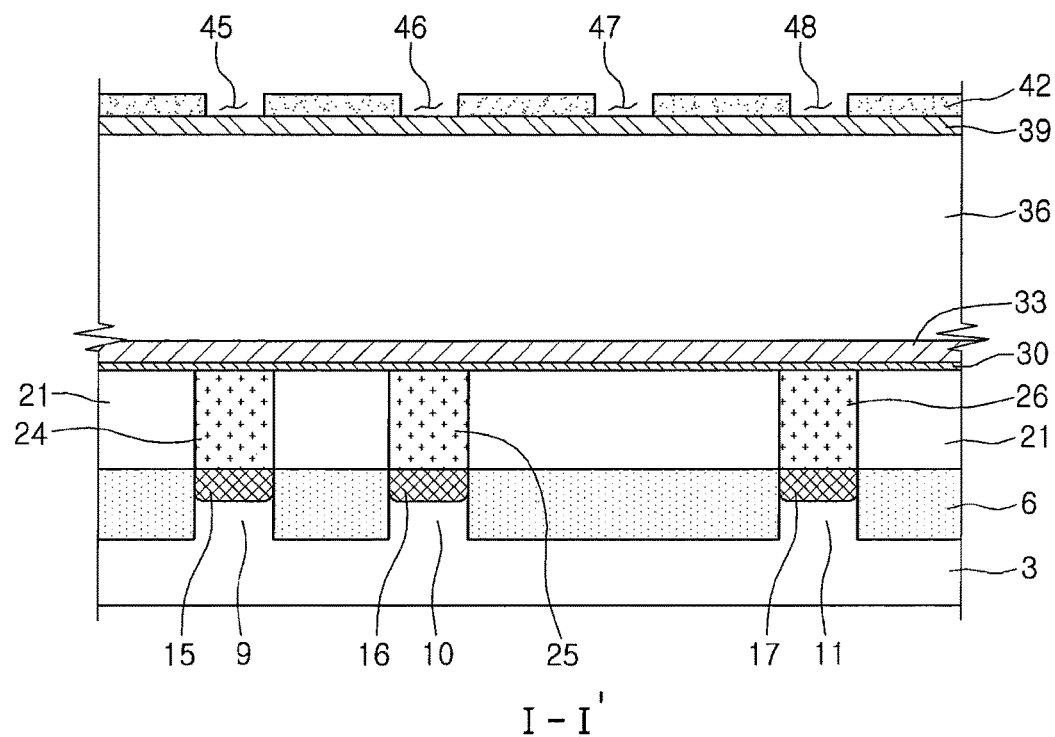
Figure 6B:
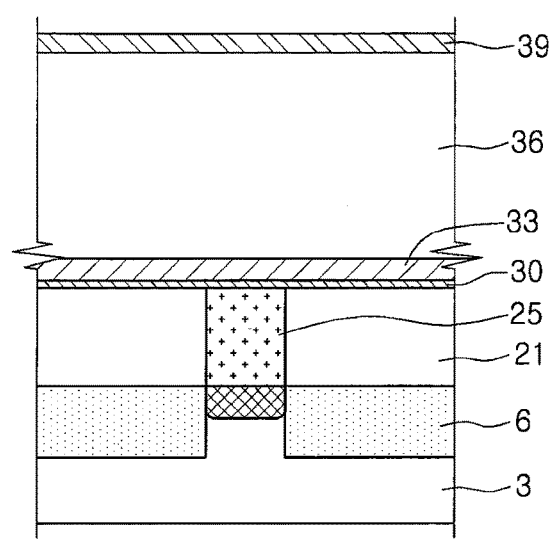

Referring to FIGS. 1, 6A, and 6B, mask opening portions 45, 46, 47, and 48 may be formed by patterning the hard mask 42. The mask opening portions 45 to 48 may have an elongated form (e.g., a line shape) and may expose portions of the capping layer 39.

Figure 7A:
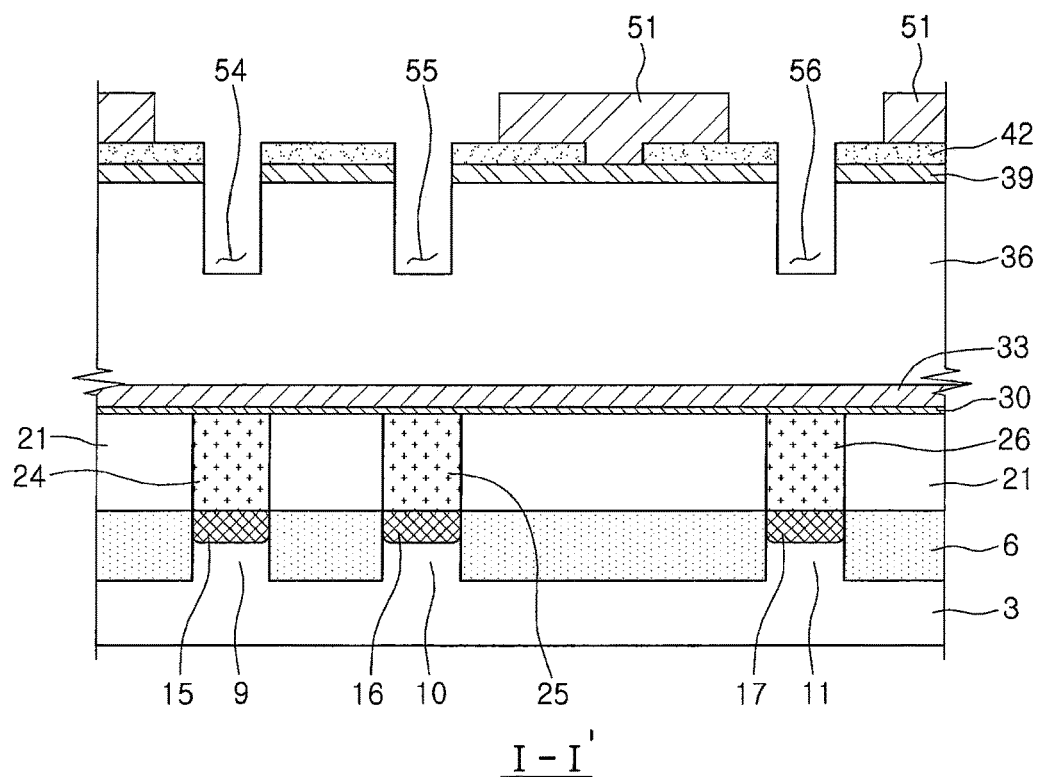
Figure 7B:
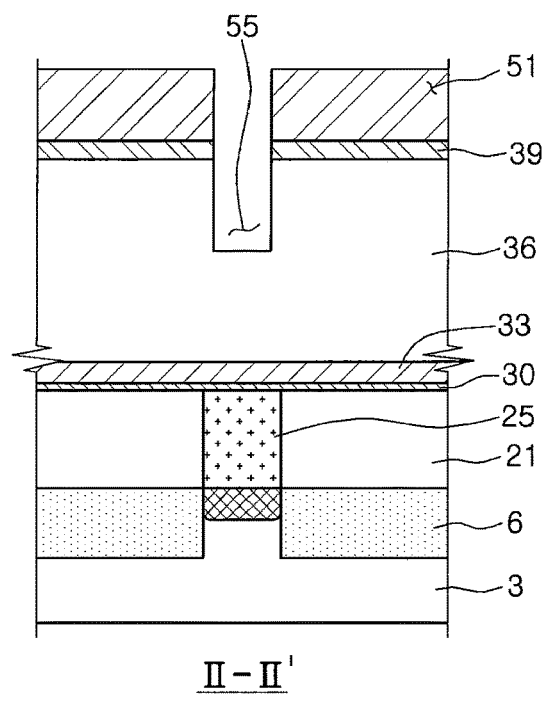

Referring to FIGS. 1, 7A, and 7B, a via mask 51 may be formed on the semiconductor substrate 3 having the mask opening portions 45 to 48, to expose portions of the mask opening portions 45 to 48 while covering portions of the hard mask 42.

Preparatory holes 54, 55, and 56 may be formed by etching portions of the capping layer 39 and the intermetal insulating layer 36, using the via mask 51 and the hard mask 42 as etching masks. Portions of the intermetal insulating layer 36 may be etched. Thus, bottom surfaces of the preparatory holes 54 to 56 may be formed inside the intermetal insulating layer 36.

Figure 8A:
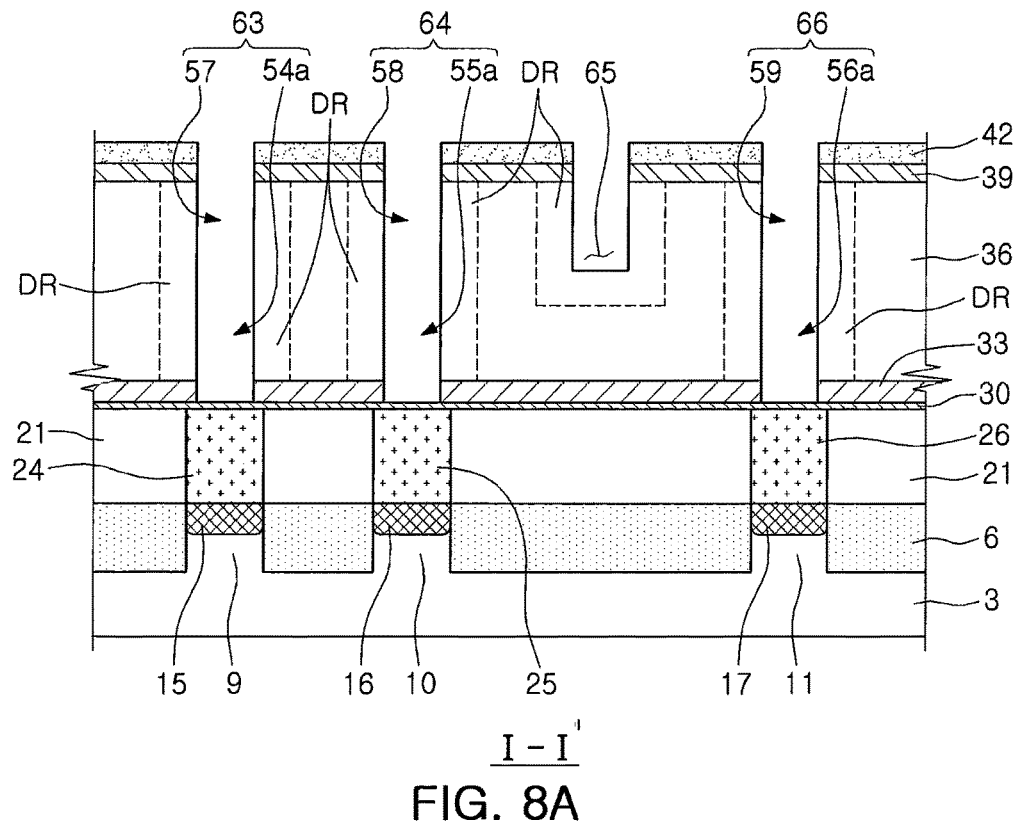
Figure 8B:
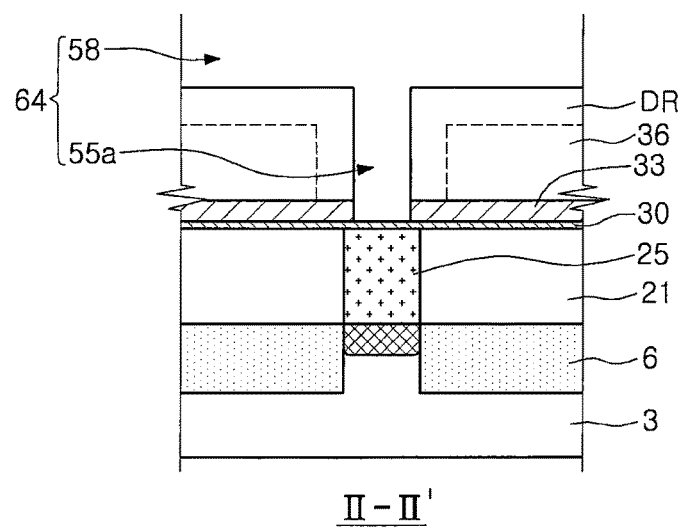

Referring to FIGS. 1, 8A, and 8B, the via mask 51 of FIGS. 7A and 7B may be removed. First to fourth damascene opening portions 63, 64, 65 and 66 may be formed by etching portions of the intermetal insulating layer 36 by an etching process, using the hard mask 42 as an etching mask.

In some embodiments, portions of the etch stop layer 30 may be exposed while the buffer layer 33 is etched simultaneously with the portions of the intermetal insulating layer 36 by an etching process using the hard mask 42 as an etching mask.

In some embodiments, the etching process may be an anisotropic etching process using plasma.

The first to fourth damascene opening portions 63 to 66 may be sequentially arranged, and may be parallel to one another.

The first, second and fourth damascene opening portions 63, 64, and 66 may include via holes 54a, 55a, and 56a and interconnection trenches 57, 58, and 59 overlapping the via holes 54a, 55a, and 56a, respectively, as illustrated in FIG. 8A.

The via holes 54a to 56a may overlap the first to third contact structures 24 to 26 respectively, as illustrated in FIG. 8A.

A depletion region DR may be formed within the intermetal insulating layer 36. The depletion region DR may be a region lacking carbon (C) within the intermetal insulating layer 36. By performing an etching process of forming the first to fourth damascene opening portions 63 to 66, the depletion region DR may be formed since carbon (C) contained in the intermetal insulating layer 36 escapes externally therefrom, and the depletion region DR may have a high dielectric constant than a remaining portion of the intermetal insulating layer 36.

In some embodiments, the depletion region DR may be formed on entire surfaces exposed by the first to fourth damascene opening portions 63 to 66 as illustrated in FIG. 8A. The present inventive concept, however, is not limited thereto.

Figure 9A:
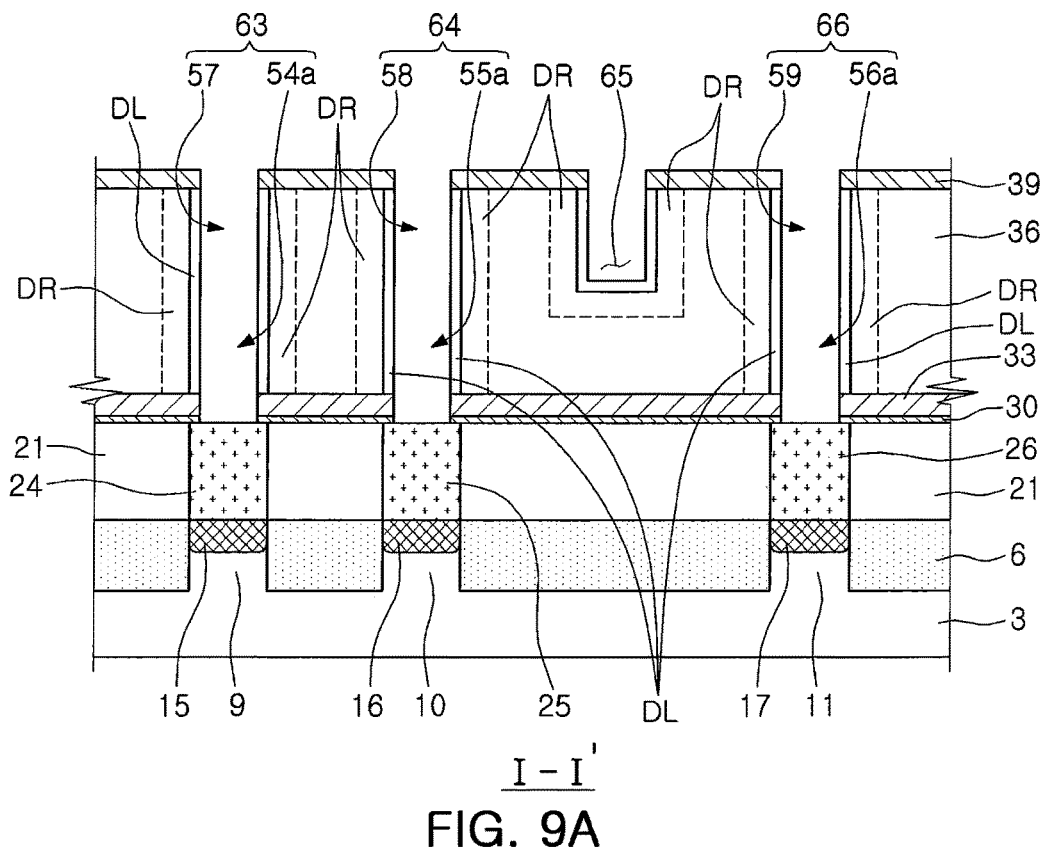
Figure 9B:
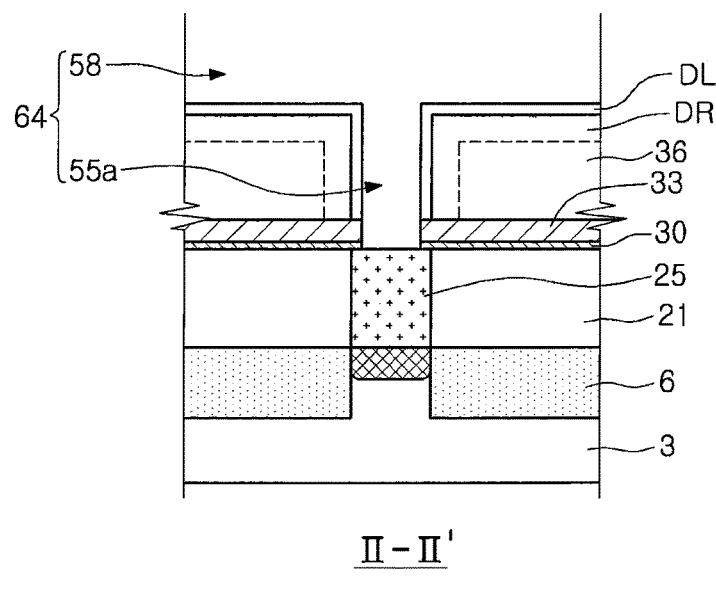

Referring to FIGS. 1, 9A, and 9B, a hardened layer DL may be formed on a surface of the depletion region DR included in the intermetal insulating layer 36 exposed by the first to fourth damascene opening portions 63 to 66. The hardened layer DL may have denser film quality than that of the intermetal insulating layer 36. The hardened layer DL may be formed while the hard mask 42 of FIG. 8A is removed, portions of the etch stop layer 30 are etched, and the portions of the first to third contact structures 24 to 26 are exposed.

In some embodiments, the exposing of the portions of the first to third contact structures 24 to 26 by etching the portions of the etch stop layer 30 during the removal of the hard mask 42 of FIG. 8A may include etching the hard mask 42 of FIG. 8A and the portions of the etch stop layer 30 by performing an etching process, and performing a surface treatment process. The surface treatment process may include a process of removing a reaction byproduct generated during the etching of the hard mask 42 of FIG. 8A and the portions of the etch stop layer 30, which remains on portions of a surface of the semiconductor substrate 3 having the first to fourth damascene opening portions 63 to 66. Such a surface treatment process may be performed using a plasma treatment process. The surface treatment process may include performing a plasma treatment process using a process gas including hydrogen (H) and nitrogen (N). For example, a process gas may include an $N_2$ gas and an $H_2$ gas. While such a surface treatment process is performed, the hardened layer DL may be formed.

Figure 10A:
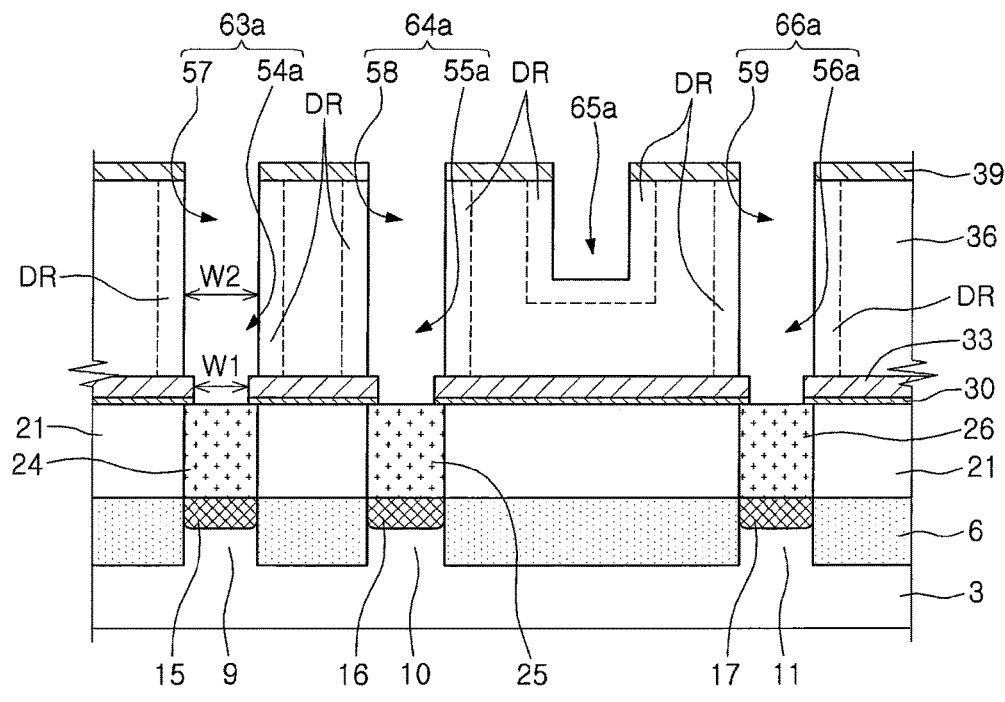
Figure 10B:
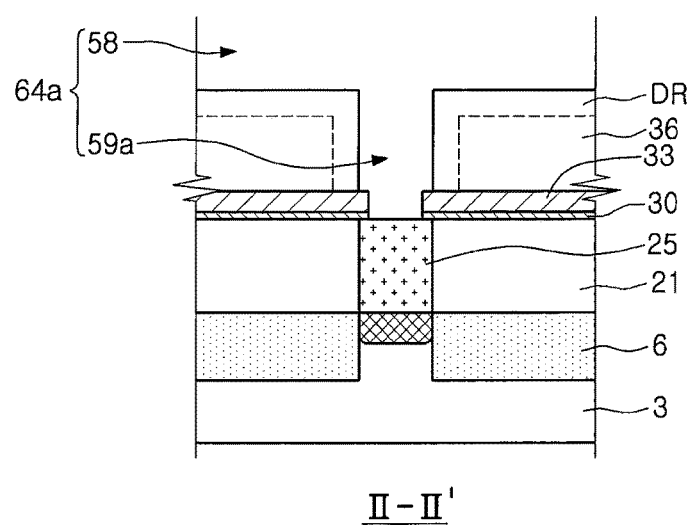

Referring to FIGS. 1, 10A, and 10B, first to fourth extended damascene opening portions 63a, 64a, 65a, and 66a may be formed by removing the hardened layers DL of FIGS. 9A and 9B. The first to fourth extended damascene opening portions 63a to 66a may be wider than the first to fourth damascene opening portions 63 to 66 of FIGS. 9A and 9B as the hardened layer DL is removed.

In some embodiments, while the hardened layer DL of FIGS. 9A and 9B is removed using an etching process, portions of the capping layer 39 may also be etched.

In some embodiments, a process of etching the hardened layer DL of FIGS. 9A and 9B may use a fluorine (F)-based chemical material. For example, the F-based chemical material may include an $F_2$ gas, an HF gas, an $NH_4F$ gas, or an $NF_3$ gas.

While the hardened layer DL of FIGS. 9A and 9B is removed, the etch stop layer 30 may not be etched. Each of the via holes 54a, 55a, and 56a of the first, second, and fourth extended damascene opening portions 63a, 64a, and 66a may have a width W2 greater than a width W1. Here, the width W1 may be a width of a portion of each of the via holes 54a to 56a defined by the etch stop layer 30, and the width W2 may be a width of a portion of each of the via holes 54a to 56a defined by the intermetal insulating layer 36.

Figure 11A:
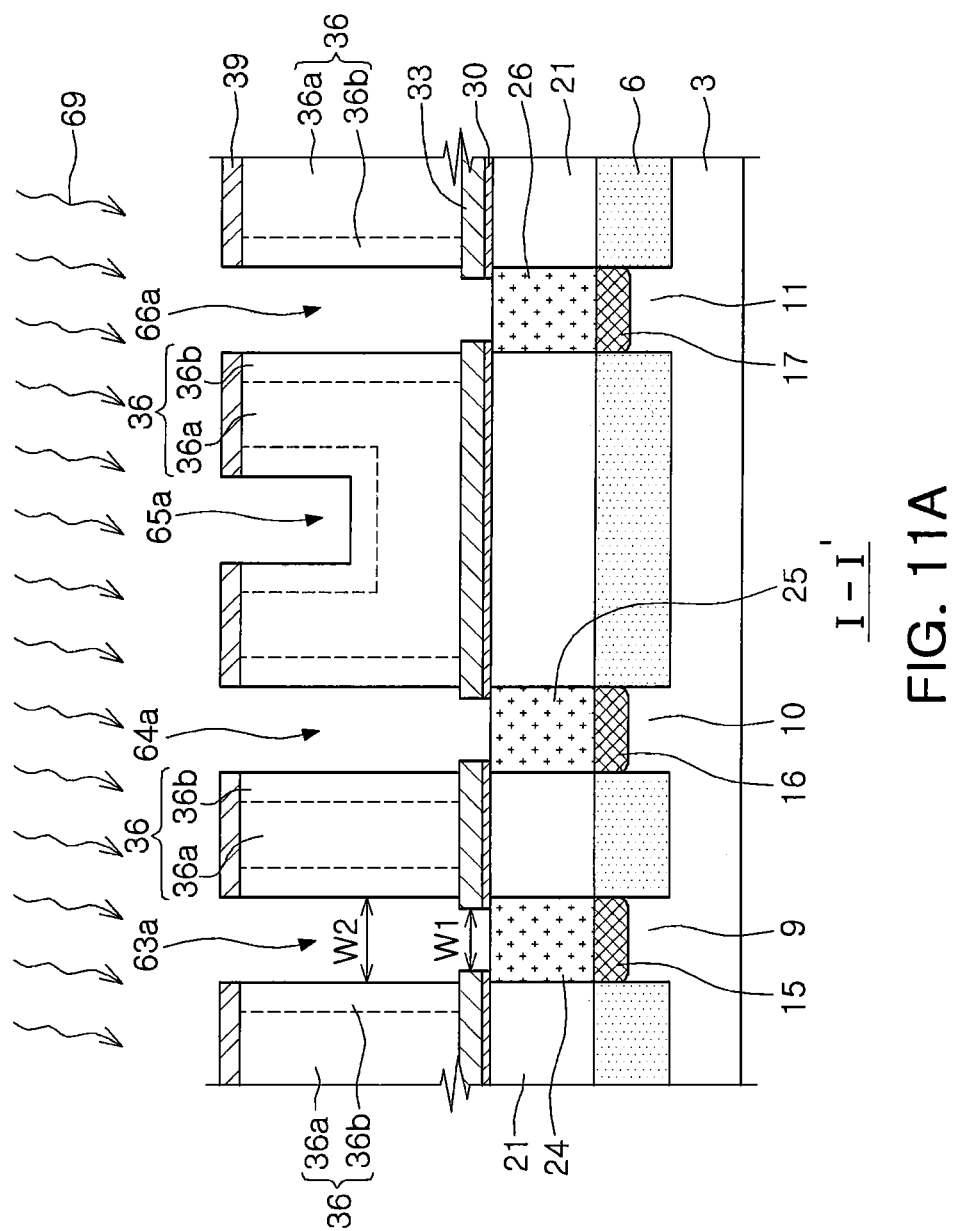
Figure 11B:
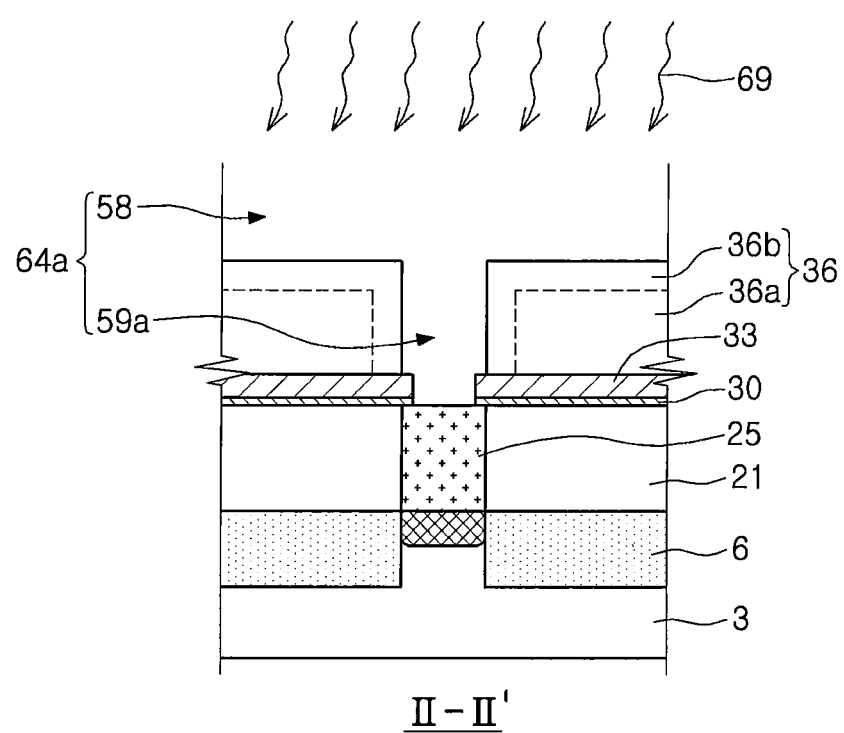

Referring to FIGS. 1, 11A, and 11B, a process 69 of injecting carbon (C) into the depletion region DR may be performed. Thus, the intermetal insulating layer 36 may include the first region 36a allowing an initial material state to be maintained, and the second region 36b formed by injecting carbon (C) into the depletion regions DR. The performing of the process 69 may include transforming the depletion region DR into the second region 36b by diffusing carbon (C) into the depletion regions DR. The second region 36b may have a dielectric constant higher than that of the first region 36a, and may include the second pores 37b of FIG. 2D, smaller than the first pores 37a included in the first region 36a, of FIG. 2D. In some embodiments, the first regions 36a define the first to fourth extended damascene opening portions 63a to 66a, as illustrated in FIGS. 11A and 11B.

In some embodiments, the forming of the second region 36b using the process 69 may include transforming the depletion region DR into the second region 36b by diffusing another element, for example, silicon (Si), together with carbon (C), into the depletion region DR.

In some embodiments, the process 69 may include diffusing silicon (Si) together with carbon (C) into the depletion region DR.

In some embodiments, the process 69 may be performed using a remote plasma process, using a silane-based chemical material. A chemical material used in the process 69 may include, for example, a methyl group. For example, the process 69 may include using a chemical material such as $(CH_3)_xSi_yL_z$. Here, L may be $N(CH_3)_2$, H, $OCH_3$, COOH, OH, or $NH_2$.

In some embodiments, the process 69 may be performed at a temperature higher than room temperature, in order to diffuse carbon (C) more stably. For example, the process 69 may be performed in an atmosphere having a temperature from about 200° C. to about 400° C.

In some embodiments, the process 69 may be performed while a surface of a semiconductor substrate having the first to fourth extended damascene opening portions 63a to 66a is irradiated with ultraviolet (UV) light, in order to diffuse carbon (C) more stably.

In some embodiments, the process 69 may be performed while the surface of the semiconductor substrate having the first to fourth extended damascene opening portions 63a to 66a is irradiated with UV light in an atmosphere having a temperature from about 200° C. to about 400° C.

In some embodiments, the process 69 may use a reducing gas, for example, an $NH_3$ gas, that can reduce a metal oxide to a metal, along with a source gas supplying carbon (C) into the depletion region DR. The metal oxide may be formed on exposed surfaces of the first to third contact structures 24 to 26.

Figure 12A:
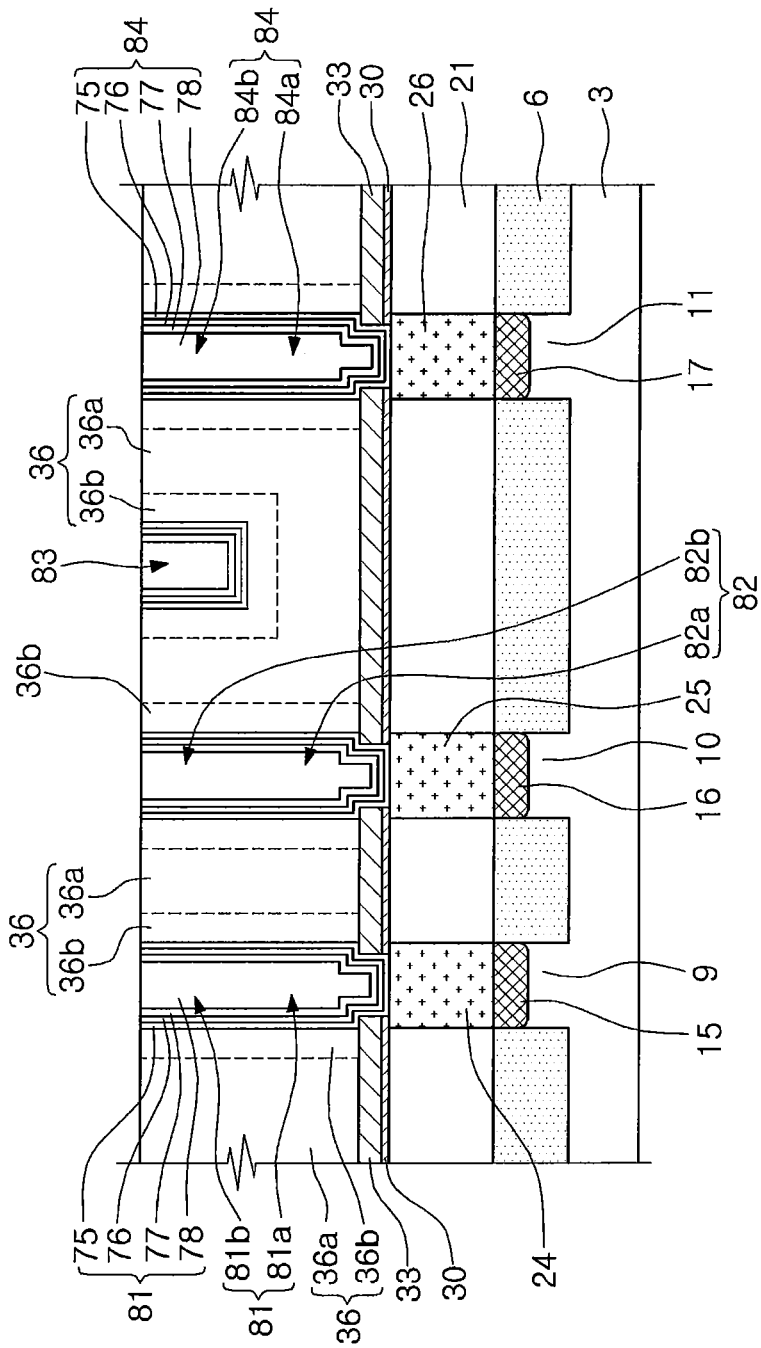
Figure 12B:
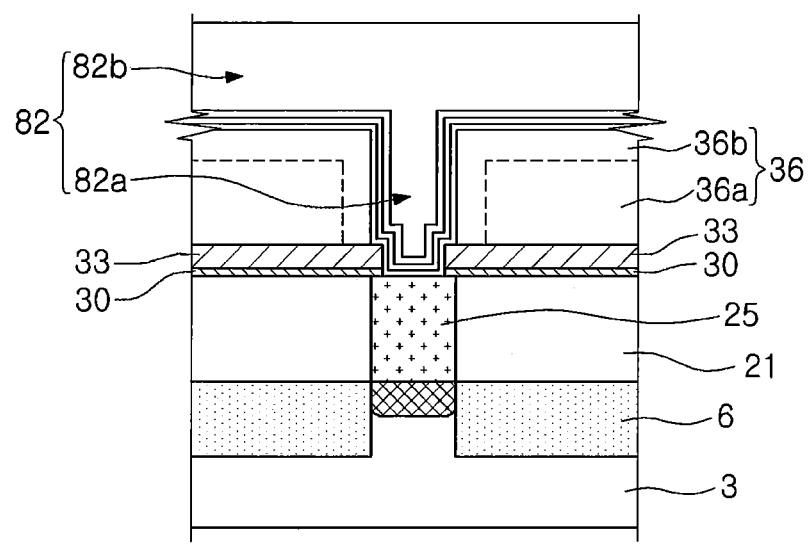

Referring to FIGS. 1, 12A, and 12B, the first conductive layer 75, the second conductive layer 76, and the seed layer 77 may be sequentially and conformally formed on the semiconductor substrate 3 having the second region 36b, the third conductive layer 78 filling the first to fourth extended damascene opening portions 63a to 66a may be formed on the seed layer 77, and the first to fourth interconnection structures 81 to 84 may be formed by planarizing the first to third conductive layers 75 to 78 and the seed layer 77 until portions of the intermetal insulating layer 36 are exposed. In some embodiments, uppermost surfaces of the first to fourth interconnection structures 81 to 84 may be coplanar with an uppermost surface of the intermetal insulating layer 36 as illustrated in FIG. 12A.

As described with reference to FIGS. 1 and 2A through 2D, the first to fourth interconnection structures 81 to 84 may include the first to fourth plug portions 81a to 84a and the first to fourth interconnection portions 81b to 84b disposed on the first to fourth plug portions 81a to 84a and integrated with the first to fourth plug portions 81a to 84a, respectively.

Referring again to FIGS. 1 and 2A through 2D, the etch stop layer 30, the buffer layer 33, the intermetal insulating layer 36, and the first to fourth interconnection structures 81 to 84 may form the first interconnection region IR1. The processes from the forming of the etch stop layer 30, as described in FIGS. 5A and 5B, to the forming of the first to fourth interconnection structures 81 to 84, as described in FIGS. 12A and 12B, may be repeated to form the second interconnection region IR2.

Figure 13:
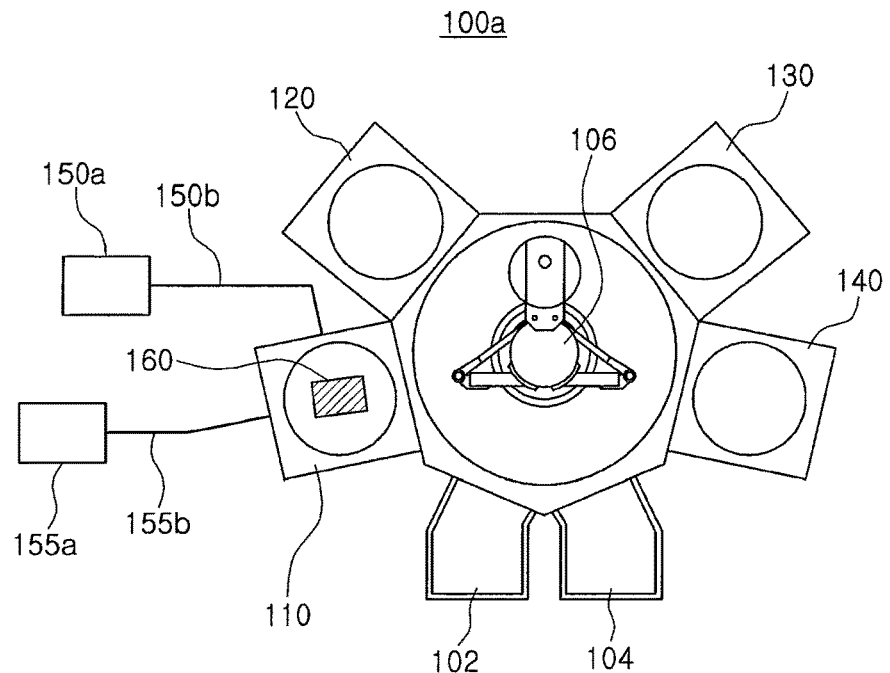
FIG. 13 is a schematic diagram of a process system for forming a semiconductor device according to some embodiments of the present inventive concept.

Referring to FIG. 13, an example of a process system for forming a semiconductor device according to some embodiments of the present inventive concept will be described. FIG. 13 is a schematic diagram of a process system 100a.

Referring to FIG. 13, the process system 100a may include a plurality of process chambers 110, 120, 130, and 140, in which a plurality of semiconductor processes are performed, a robot system 106 disposed between the process chambers 110 to 140 to transfer a substrate, and transfer chambers 102 and 104 transferring the substrate inwardly to or outwardly from the process system 100a. The transfer chambers 102 and 104 may be substituted with a loadlock chamber. As illustrated in FIG. 13, the number of the process chambers 110 to 140 may be four, but the present inventive concept is not limited thereto. For example, the number of the process chambers 110 to 140 may be determined by the number of semiconductor processes to be performed.

At least two of the semiconductor processes described in FIGS. 5A through 12B may be performed under vacuum by the process system 100a. For example, in any one of the process chambers 110 to 140, the removing of the hardened layer DL of FIGS. 9A and 9B described in FIGS. 10A and 10B, and the process 69 described in FIGS. 11A and 11B may be performed in sequence.

The process system 100a may include a first material supply device 150a, which supplies a material, for example, a fluorine (F)-based chemical material, used for the removing of the hardened layer DL of FIGS. 9A and 9B described in FIGS. 10A and 10B, and a first pipe 150b, which connects the first material supply device 150a to the process chamber 110.

Further, the process system 100a may include a second material supply device 155a, which supplies a material, for example, a silane-based chemical material, used for the process 69 described in FIGS. 11A and 11B, and a second pipe 155b, which connects the second material supply device 155a to the process chamber 110.

Moreover, the process system 100a may include a device 160, which is configured to form an atmosphere having a temperature from about 200° C. to about 400° C. while performing the process 69 as described in FIGS. 11A and 11B or configured to irradiate a surface of a semiconductor substrate having the first to fourth extended damascene opening portions 63a to 66a of FIGS. 11A and 11B with UV light. The device 160 may be installed in the process chamber 110.

As described in FIG. 13, in any one of the process chambers 110 to 140, the removing of the hardened layer DL of FIGS. 9A and 9B described in FIGS. 10A and 10B and the process 69 described in FIGS. 11A and 11B may be performed in sequence. However, the present inventive concept is not limited thereto. A process system 100b, which may perform the removing of the hardened layer DL of FIGS. 9A and 9B described in FIGS. 10A and 10B and the process 69 described in FIGS. 11A and 11B in separate process chambers, will be described with reference to FIG. 14.

Figure 14:
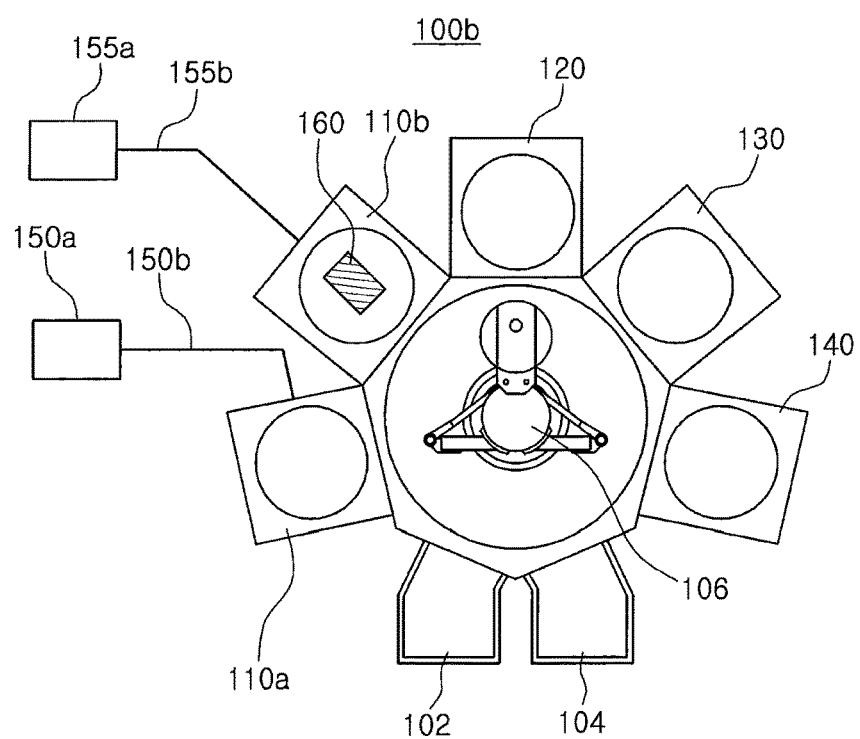
FIG. 14 is a schematic diagram of a process system for forming a semiconductor device according to some embodiments of the present inventive concept.

Referring to FIG. 14, the process system 100b may include a first process chamber 110a, in which the removing of the hardened layer DL of FIGS. 9A and 9B described in FIGS. 10A and 10B may be performed, and a second process chamber 110b, in which the process 69 described in FIGS. 11A and 11B may be performed, together with a plurality of process chambers 120 to 140.

The process system 100b may include a first material supply device 150a, which supplies a material, for example, a fluorine (F)-based chemical material, used for the removing of the hardened layer DL of FIGS. 9A and 9B as described in FIGS. 10A and 10B, and a first pipe 150b, which connects the first material supply device 150a to the first process chamber 110a. Further, the process system 100b may include a second material supply device 155a, which supplies a material, for example, a silane-based chemical material, used for the process 69 as described in FIGS. 11A and 11B, and a second pipe 155b, which connects the second material supply device 155a to the second process chamber 110b. Further, a device 160, which is configured to form an atmosphere having a temperature from about 200° C. to about 400° C. or to irradiate a surface of a semiconductor substrate having the first to fourth extended damascene opening portions 63a to 66a of FIGS. 11A and 11B with UV light as described in FIG. 13, may be installed in the second process chamber 110b.

As set forth above, according to example embodiments of the present inventive concept, parasitic capacitance between interconnection structures may be reduced by forming an intermetal insulating layer formed of a low-k dielectric material therebetween. Further, in plug portions of the interconnection structures, portions of the plug portions surrounded by the intermetal insulating layer may be wider than lower surfaces of the plug portions contacting lower contact structures, thereby improving electrical characteristics of the interconnection structures. Thus, performance of a semiconductor device may be improved.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
an etch stop layer on a lower structure that comprises a contact structure;
a buffer layer on the etch stop layer;
an intermetal insulating layer on the buffer layer, the intermetal insulating layer comprising a low-k dielectric material and comprising a first region having a first dielectric constant and a second region having a second dielectric constant that is different from the first dielectric constant, and the intermetal insulating layer being a single layer; and
an interconnection structure having a plug portion electrically connected to the contact structure and an interconnection portion on the plug portion, the first region of the intermetal insulating layer being spaced apart from the interconnection structure,
wherein the plug portion comprises a first portion extending through the etch stop layer and a second portion that is in the intermetal insulating layer and has a width greater than a width of the first portion, and
wherein the interconnection portion comprises opposing lateral surfaces surrounded by the intermetal insulating layer.

2. The semiconductor device of claim 1, wherein the second region of the intermetal insulating layer is between the first region of the intermetal insulating layer and the interconnection structure.

3. The semiconductor device of claim 2, wherein the second dielectric constant of the second region of the intermetal insulating layer is greater than the first dielectric constant of the first region of the intermetal insulating layer.

4. The semiconductor device of claim 1, wherein the buffer layer comprises an insulating material having a third dielectric constant that is greater than the first dielectric constant of the first region of the intermetal insulating layer and the second dielectric constant of the second region of the intermetal insulating layer.

5. The semiconductor device of claim 1, wherein the buffer layer has a thickness greater than a thickness of the etch stop layer.

6. The semiconductor device of claim 1, wherein the etch stop layer comprises an insulating nitride having an etching selectivity with respect to both the buffer layer and the intermetal insulating layer.

7. The semiconductor device of claim 1, wherein the opposing lateral surfaces of the interconnection portion are aligned with lateral surfaces of the plug portion in a vertical direction.

8. The semiconductor device of claim 1, wherein the first region of the intermetal insulating layer comprises a first pore, and
wherein the second region of the intermetal insulating layer comprises a second pore that is smaller than the first pore.

9. The semiconductor device of claim 1, wherein the plug portion comprises a third portion extending through the buffer layer, and
wherein the third portion has a width different from at least one of the width of the first portion and the width of the second portion.

10. The semiconductor device of claim 1, wherein the interconnection portion has an uppermost surface that is coplanar with an uppermost surface of the intermetal insulating layer.

11. A semiconductor device comprising:
an etch stop layer on a lower structure;
an intermetal insulating layer on the etch stop layer, the intermetal insulating layer comprising a low-k dielectric material; and
a first interconnection structure and a second interconnection structure adjacent to each other,
wherein the intermetal insulating layer comprises a first region that is spaced apart from the first and second interconnection structures and has a first dielectric constant, and second regions that contact the first and second interconnection structures and have a second dielectric constant different from the first dielectric constant of the first region,
wherein the first interconnection structure comprises a first plug portion and a first interconnection portion on the first plug portion, and the second interconnection structure comprises a second plug portion and a second interconnection portion on the second plug portion,
wherein each of the first plug portion and the second plug portion comprises a lower portion contacting the etch stop layer and an upper portion contacting the intermetal insulating layer, and
wherein a distance between respective sidewalls of the lower portions of the first plug portion and the second plug portion is greater than a distance between respective sidewalls of the upper portions of the first plug portion and the second plug portion.

12. The semiconductor device of claim 11, further comprising:
a buffer layer that is between the intermetal insulating layer and the etch stop layer and has a thickness greater than a thickness of the etch stop layer,
wherein the buffer layer comprises an insulating material having a third dielectric constant that is greater than the first and second dielectric constants of the first region and second regions of the intermetal insulating layer respectively.

13. The semiconductor device of claim 11, wherein the second dielectric constant of the second regions of the intermetal insulating layer is greater than the first dielectric constant of the first region of the intermetal insulating layer.

14. The semiconductor device of claim 11, wherein the first region of the intermetal insulating layer comprises first pores, and the second regions of the intermetal insulating layer comprise second pores that have an average size smaller than an average size of the first pores.

15. The semiconductor device of claim 11, wherein the lower structure comprises an interlayer insulating layer and contact structures that extend through the interlayer insulating layer and contact the first plug portion and the second plug portion, respectively, and
wherein the lower portions of the first plug portion and the second plug portion have a width less than a width of upper surfaces of the contact structures.

16. An integrated circuit device comprising:
an etch stop layer on a lower structure, the etch stop layer comprising an opening exposing the lower structure;
an insulating layer comprising a low-k material on the etch stop layer, the insulating layer comprising a recess, and the insulating layer comprising a first portion that defines the recess and has a first dielectric constant and a second portion that is different from the first portion and has a second dielectric constant less than the first dielectric constant; and
a conductive structure in the recess of the insulating layer and in the opening of the etch stop layer.

17. The device of claim 16, wherein the first portion of the insulating layer comprises first vacancies, and the second portion of the insulating layer comprises second vacancies, and
wherein an average size of the first vacancies is smaller than an average size of the second vacancies.

18. The device of claim 16, wherein the recess comprises a lower portion and an upper portion sequentially arranged from the etch stop layer,
wherein the lower portion of the recess has a first width in a first direction, and the upper portion of the recess extends longitudinally in the first direction and has a length in the first direction that is greater than the first width of the lower portion of the recess, and
wherein the conductive structure comprises a conductive layer conformally extending on surfaces of the lower portion and the upper portion of the recess, and an uppermost surface of the conductive structure and an uppermost surface of the insulating layer are coplanar.

19. The device of claim 18, wherein the opening of the etch stop layer has a second width in the first direction that is less than the first width of the lower portion of the recess.

20. The device of claim 16, wherein the recess comprises a lower portion and an upper portion sequentially arranged from the etch stop layer,
wherein the lower portion of the recess has a width in a first direction, and the upper portion of the recess extends longitudinally in the first direction and has a length in the first direction that is greater than the width of the lower portion of the recess,
wherein the conductive structure comprises a plug portion in the lower portion of the recess and an interconnection portion in the upper portion of the recess, and
wherein the first portion of the insulating layer surrounds the plug portion of the conductive structure and extends on a lower surface and a side of the interconnection portion of the conductive structure.

* * * * *